(12) United States Patent
Shih et al.

(10) Patent No.: US 8,168,976 B2
(45) Date of Patent: May 1, 2012

(54) DISPLAY PANEL AND METHOD FOR MANUFACTURING THE SAME

(75) Inventors: Chih-Hung Shih, Yilan County (TW); Chih-Chun Yang, Hsinchu County (TW); Ming-Yuan Huang, Taipei County (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 12/576,840

(22) Filed: Oct. 9, 2009

(65) Prior Publication Data
US 2010/0025698 A1 Feb. 4, 2010

Related U.S. Application Data

(62) Division of application No. 11/727,448, filed on Mar. 27, 2007, now Pat. No. 7,663,145.

(30) Foreign Application Priority Data

Aug. 16, 2006 (TW) .............................. 95130146 A

(51) Int. Cl.
H01L 29/04 (2006.01)

(52) U.S. Cl. .............................. 257/59; 257/72; 257/258
(58) Field of Classification Search .................... 257/59, 257/72, 258
See application file for complete search history.

(56) References Cited

U.S. PATENT DOCUMENTS

| 2001/0022387 | A1 | 9/2001 | Sano et al. |
| 2003/0230753 | A1 | 12/2003 | Steckl et al. |
| 2004/0095544 | A1 | 5/2004 | Chang et al. |
| 2006/0009108 | A1* | 1/2006 | Shigeno ..................... 445/24 |
| 2007/0222375 | A1 | 9/2007 | Liu et al. |

* cited by examiner

Primary Examiner — Long Pham
(74) Attorney, Agent, or Firm — Rabin & Berdo, P.C.

(57) ABSTRACT

A display panel includes a substrate having a display area and a blank area. The blank area includes at least one of a non-metal line region and a metal-line region. The non-metal region includes a plurality of insulating patterns and a first conductive pattern layer formed on the substrate. The insulating patterns are isolated from each other by the first conductive pattern layer. The metal-line region includes an insulating multilayer formed on the substrate and a conductive pattern layer formed on the insulating multilayer. Several isolated zones are formed by the conductive pattern layer on the surface of the insulating multilayer.

7 Claims, 10 Drawing Sheets

DISPLAY PANEL AND METHOD FOR MANUFACTURING THE SAME

CROSS REFERENCE TO RELATED APPLICATIONS

This application is a Divisional of pending U.S. patent application Ser. No. 11/727,448, filed Mar. 27, 2007 and entitled "DISPLAY PANEL AND METHOD FOR MANUFACTURING THE SAME". This application claims the benefit of Taiwan Patent Application No. 95130146, filed Aug. 16, 2006, the contents of which are herein incorporated by reference in its entirety.

BACKGROUND OF THE INVENTION

1. Field of the Invention

The present invention relates to a display panel and a method of manufacturing the same and, more particularly, to a panel and a manufacturing method which can to reduce the removing photoresist time and to prevent a result of photoresist residues.

2. Description of the Related Art

FIG. 1 schematically shows a display panel. The display panel includes a display area 11, a periphery area 12, and a blank area. The periphery area 12 is electrically connected to the display area 11 to control a display image shown in the display area 11. Several thin film transistors, storage capacitors, and driving devices are formed in the display area 11 and the periphery area 12, respectively. As shown in FIG. 1, the dotted lines between the periphery area 12 and the display area 11 represent metal lines formed in a substrate. The metal lines are electrically connected to the periphery area 12 and the display area 11. Furthermore, a dotted circle in FIG. 1 represents a pixel in the display area 11. Each pixel is defined by signal lines, such as scan lines and data lines, crossing over each other (not shown in FIG. 1). At least one thin film transistor (not shown in FIG. 1) and one storage capacitor (such as Cst, Clc, etc) are formed in each pixel. The portions besides the display area 11 and the periphery area 12 are defined as blank areas including 13a, 13b, and 13c, wherein the blank area 13c is the largest one among them.

In the development of display panels (such as a thin film transistor liquid crystal display panel (TFT-LCD), etc), the manufacturing processes for decreasing the number of masks and reducing the manufacturing time and cost have been revealed. However, the photoresist residues and conductive layers remained in the blank area are the issues of concern in the conventional process of manufacturing TFT-LCD, especially the residues remained in the largest blank area 13c.

FIG. 2A~FIG. 2H are a conventional method of manufacturing a display panel for decreasing the number of the masks. Referring to FIG. 1 and FIG. 2A~FIG. 2H together, a first metal layer is deposited on a substrate 20. Then, the first metal layer is etched (by using a first mask) to form a gate electrode 211 and a bottom electrode 241 of a storage capacitor (Cst) within the display area 11 of the substrate 20, as shown in FIG. 2A.

Afterward, a gate insulating layer 212 is formed on the gate electrode 211. For example, the gate insulating layer 212 is made of silicon nitride (SiNx). The gate insulating layer 212 covers the bottom electrode 241 of the storage capacitor (Cst) and the blank area 13b/13c of the substrate 20. Next, a channel layer 213, an ohmic contact layer 214, and a second metal layer 215 are sequentially formed on the gate insulating layer 212. The second metal layer 215 is then etched (by using a second mask) to form a source S, a drain D, and a channel region 216 between the source S and the drain D, as shown in FIG. 2B.

Next, a passivation layer 217 is disposed to cover the source S, the drain D, and the channel region 216 in area of the TFT device. The passivation layer 217 is also formed on a portion of the gate insulating layer 212 of the bottom electrode 241 of the storage capacitor and on the gate insulating layer 212 in the blank area 13b/13c, as shown in FIG. 2C. For example, the passivation layer 217 is made of silicon nitride (SiNx). Furthermore, the gate insulating layer 212 and the passivation layer 217 can be called as an insulating multilayer hereinafter.

Afterward, photoresist layers 218a, 218b and 218c are formed on the passivation layer 217 by using a mask with a halftone area (a third mask not shown in FIG. 2D). The photoresist layer 218a is formed in a region corresponding to the TFT device. The photoresist layer 218b is formed within the display area 11 except the region corresponding to the TFT device. The photoresist layer 218c is formed in the blank area 13b/13c, as shown in FIG. 2D. Also, a hole 219 is formed in the display area 11 to expose part of the drain/source in the TFT device, as shown in FIG. 2E. The height of the photoresist layer 218a is substantially identical to that of the photoresist layer 218c. The height of the photoresist layer 218b is less than that of the photoresist layers 218a and 218c.

Next, the photoresist layers 218a, 218b, and 218c are etched. The photoresist layer 218b which is not in the TFT device is completely removed. The photoresist layer 218a' over the TFT device and the photoresist layer 218c' in the blank area 13b/13c are partially removed and become thinner as shown in FIG. 2F.

Then, a conductive layer 220 is formed to cover the photoresist layer 218a' over the TFT device in the display area 11 and the photoresist layer 218c' in the blank area 13b/13c. As shown in FIG. 2G, the conductive layer 220 also covers a portion of the passivation layer 217 on the storage capacitor (Cst) in the display area 11, and acts as a top electrode of the storage capacitor. The conductive layer 220 could be made of indium tin oxide (ITO).

Finally, the photoresist layers are removed by a lift-off step. As shown in FIG. 2H, the photoresist layer 218a' in the display area 11, the conductive layer 220 on the photoresist layer 218a' in the display area 11, the photoresist layer 218c' in the blank area 13b/13c and the conductive layer 220 on the photoresist layer 218c' in the blank area 13b/13c are removed together in this step.

In the above manufacturing process for decreasing the number of masks, the photoresist layers should be removed completely under an ideal lift-off condition. However, in the restricted manufacturing time, it is not easy to completely remove the photoresist layers with large area, such as in the blank area 13c. Accordingly, residues of the photoresist layers and the conductive layers could be easily remained. Thus, the quality of the display panel is decreased. In general, residues remained is due to the length L of the photoresist layer (referring to FIG. 2G, L is marked on the photoresist layer 218c') is greater than 1500 µm.

SUMMARY OF THE INVENTION

The present invention provides a display panel and a method for manufacturing the same to remove photoresist layers completely without the result of photoresist residues in the restricted manufacturing time.

The present invention provides a display panel including a substrate having a display area and a blank area. The blank area is adjacent to the display area and includes a non-metal line region. The non-metal line region includes several insulating patterns and a first conductive pattern layer formed over the substrate. The insulating patterns are isolated by the first conductive pattern layer.

The present invention also provides a display panel including a substrate having a display area and a blank area. The blank area is adjacent to the display area and includes a metal-line region. The metal-line region includes an insulating multilayer and a conductive pattern layer. The insulating multilayer is formed on the substrate. The conductive pattern layer is formed on the insulating multilayer. Several insulated zones are isolated by the conductive pattern layer on the surface of the insulating multilayer.

The present invention another provides a method for manufacturing a display panel. The display panel includes a substrate having a display area, a periphery area, and a blank area. The blank area includes a non-metal line region. The method includes forming several thin film transistors (TFT), capacitors, and driving devices in the display area and the periphery area, respectively, and the blank area having an insulating multilayer; forming a photoresist pattern layer in the display area, the periphery area, and the blank area, so as to form a plurality of photoresist regions in a non-metal line region of the blank area and located on the insulating multilayer; exposing part of drain/source of the TFT device of the display area via at least a hole of the photoresist pattern layer, and etching the insulating multilayer according to the photoresist regions so as to form a plurality of insulating patterns in the non-metal line region of the blank area and the photoresist regions located on the insulating patterns; etching the photoresist layer in the display area and the photoresist regions in the non-metal line region of the blank area, and removing the photoresist layer except on the TFT devices in the display area, so as to form a first photoresist part on the TFT devices and a second photoresist part on the insulating patterns of the blank area; forming a conductive layer in the display area, the periphery area, and the blank area to cover the first photoresist part of the TFT devices in the display area, to cover a portion of the substrate in the blank area, to cover the second photoresist part, and filling into the hole of each TFT device; and removing the first photoresist part in the display area, the conductive layer on the first photoresist part, the second photoresist part in the non-metal line region of the blank area, and the conductive layer on the second photoresist layer, simultaneously.

The present invention further provides a method for manufacturing a display panel having a substrate comprising a display area, a periphery area, and a blank area, the method comprising: forming a plurality of thin film transistor (TFT) devices and a plurality of driving devices in the display area and the periphery area, respectively, and the blank area having an insulating multilayer; forming a photoresist pattern layer in the display area, the periphery area, and the blank area, so as to form a plurality of photoresist bumps in a metal line region of the blank area and located on the insulating multilayer; exposing part of drain/source of the TFT device of the display area via at least a hole of the photoresist pattern layer; etching the photoresist layer in the display area, the photoresist layer in the metal-line region of the blank area, and the photoresist bumps, to remove the photoresist layer except on the TFT devices in the display area, so as to form a first photoresist part on the TFT devices and a third photoresist part in the metal-line region in the blank area on the insulating multilayer; forming a conductive layer in the display area, the periphery area, and the blank area to cover the first photoresist part on the TFT devices in the display area, a portion of the insulating multilayer in the metal-line region of the blank area and the third photoresist part, and filling in the hole of each TFT device; and removing the first photoresist part in the display area, the conductive layer covering the first photoresist part, the third photoresist part in the metal-line region of the blank area, and the conductive layer covering the third photoresist part, simultaneously.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
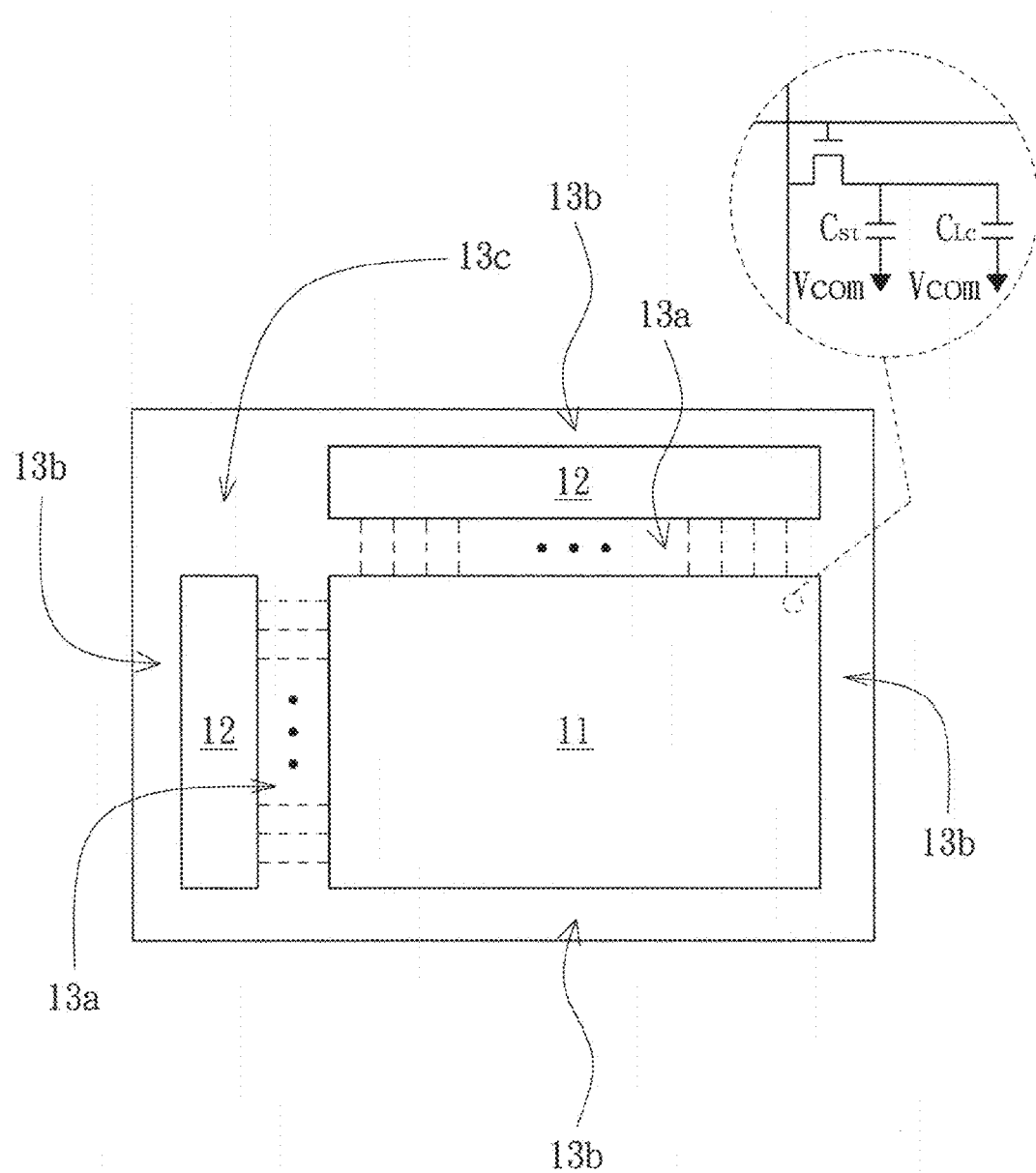
FIG. 1 is a top view of a display panel.
Figure 2A:
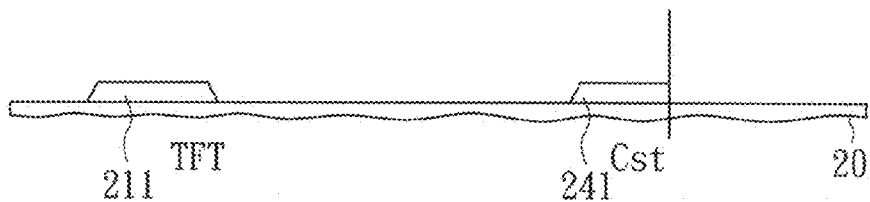
FIG. 2A~FIG. 2H (Prior Art) are a conventional method for manufacturing a display panel for decreasing the number of masks.
Figure 2B:
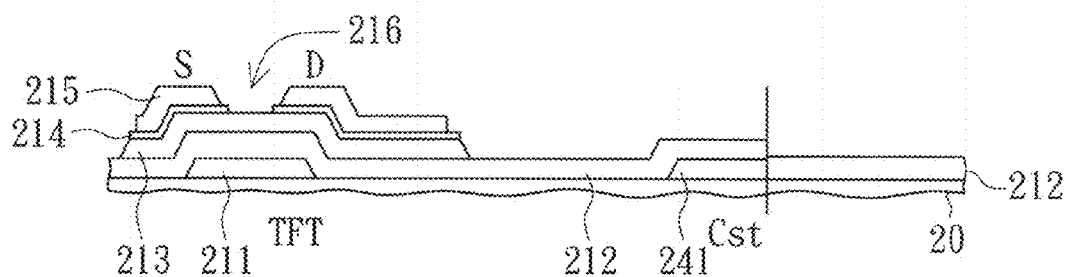
Figure 2C:
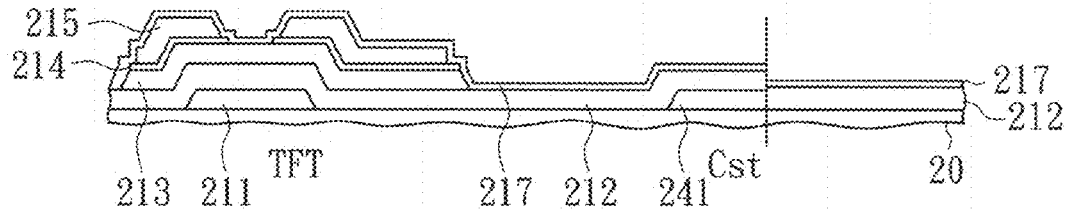
Figure 2D:
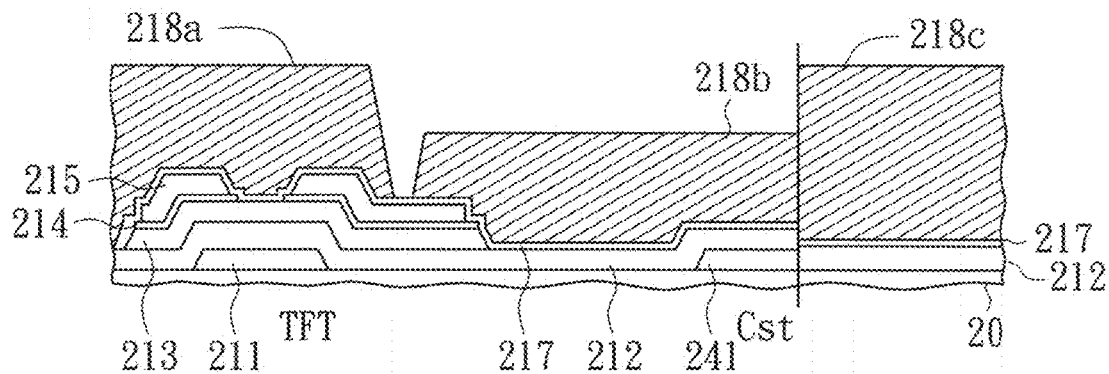
Figure 2E:
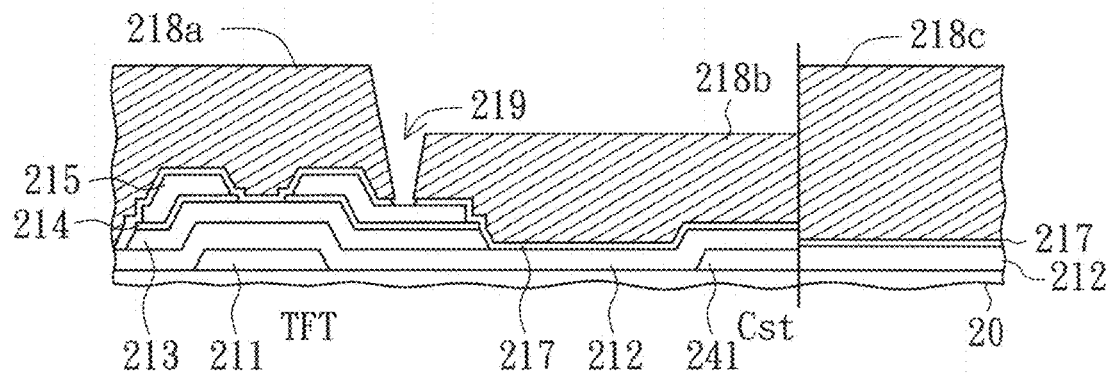
Figure 2F:
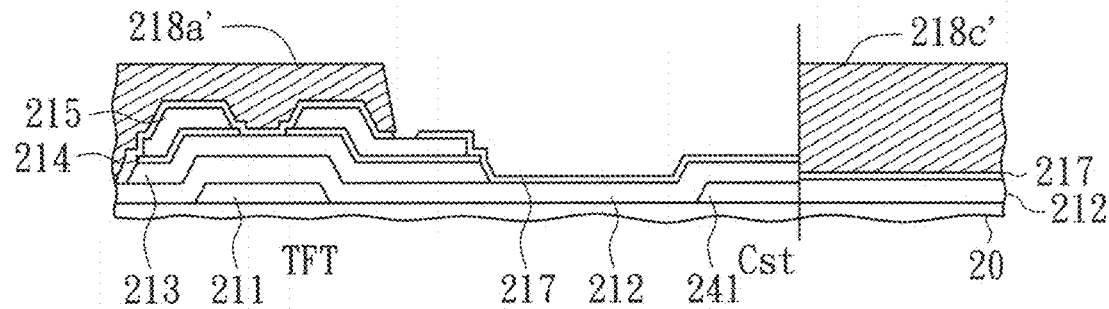
Figure 2G:
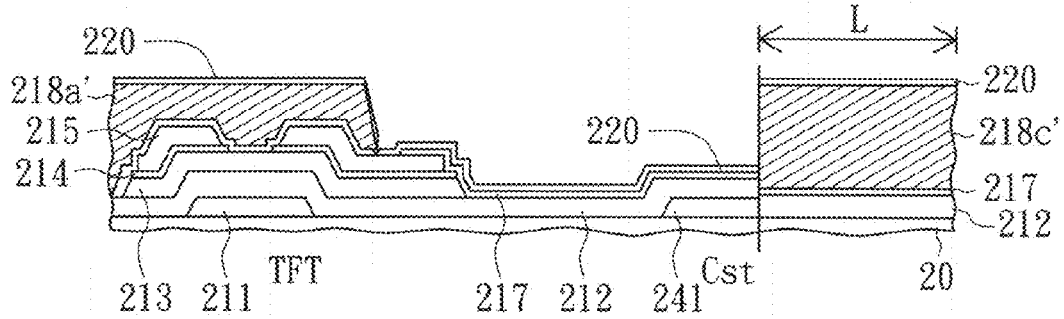
Figure 2H:
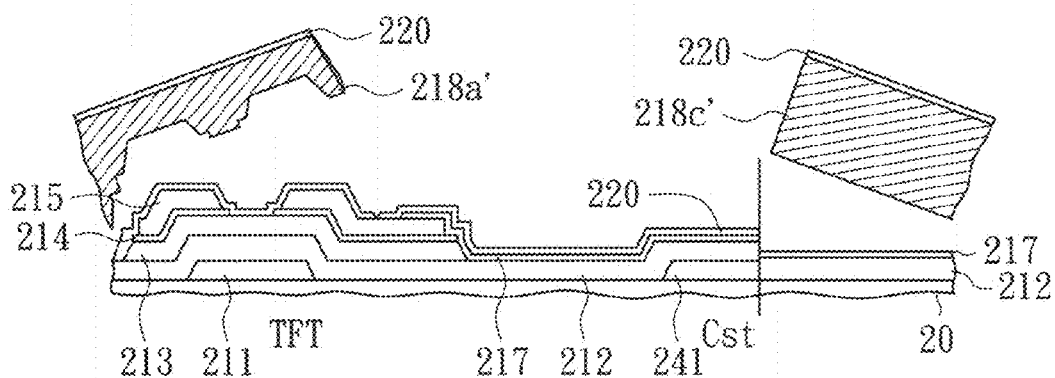

A method for manufacturing a display panel is provided by the present invention for reducing the time of removing photoresist and preventing residues of photoresist and conductive layers remained on the panel. The method of the present invention is particularly useful for completely removing the photoresist layer in a blank area. Referring to FIG. 1, the areas beside the display area 11 and the periphery area 12 are defined as blank areas, including the areas 13a, 13b, and 13c. As shown in FIG. 1, the blank area 13a is between the periphery area 12 and the display area 11. The blank area 13b includes the area adjacent to the periphery area 12 and not located between the periphery area 12 and the display area 11, the area adjacent to one side of the periphery area 12, adjacent to one side of the display area 11, adjacent to one side of the blank area 13a, and the area adjacent to the display area 11. The blank area 13c is located on a corner of the display panel. In the present embodiment of the invention, the blank area 13c is denoted as the area on the top left corner. However, the position of the blank area 13c in the present invention is not limited thereto. Furthermore, it is known by the person skilled in the art that the display panel includes a large number of pixels. Only one circuit diagram (including signal lines, such as gate line and data line, TFT, and a storage capacitor) of a pixel is illustrated in the display area 11 in FIG. 1.

The components which are the same as those in FIG. 2A~FIG. 2H retain the same reference numbers in the figures of the present embodiment of the invention. Moreover, the manufacturing process of the thin film transistor is known by anyone who has ordinary skill in the field of the invention and to give unnecessary illustrated in details. Additionally, the drawings used for illustrating the embodiment and applications of the present invention only show the major characteristic parts in order to avoid obscuring the present invention. Accordingly, the specification and the drawings are to be regard as an illustrative sense rather than a restrictive sense.

First Embodiment

Figure 3A:
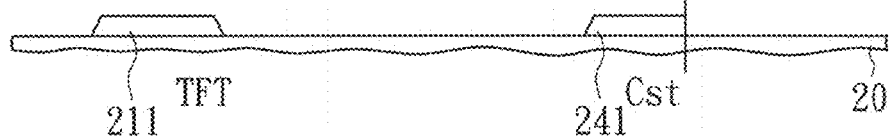
FIGS. 3A~FIG. 3H are a method for manufacturing a display panel according to the first embodiment of the present invention.

FIG. 3A~FIG. 3H are a method for manufacturing a display panel according to the first embodiment of the present invention. The blank area 13b/13c is illustrated as an example in the present embodiment. Metal lines or patterns are usually not disposed under an insulating multilayer in the blank area 13b/13c. Therefore, the blank area 13b/13c could be also called as a non-metal line region or non-metal pattern region. However, it is noted that the manufacturing method of the first embodiment can be also applied to other blank areas, such as the blank area 13a. Moreover, one pixel is illustrated as an example in the present embodiment. Each pixel includes at least one TFT device and at least one storage capacitor. However, it is known that the display panel includes numerous pixels and each pixel can include several TFT devices and/or several storage capacitors. Referring to FIG. 3A and FIG. 1 at the same time. First, a substrate 20 is provided, and a first metal layer is formed on the substrate 20. Then, the first metal layer is etched (by using a first mask) to form the gate electrode 211 in the TFT device of the display area 11, the gate line (not shown), the bottom electrode 241 of the storage capacitor (Cst), and contact pads (not shown) connected to the end of the gate line.

Figure 3B:
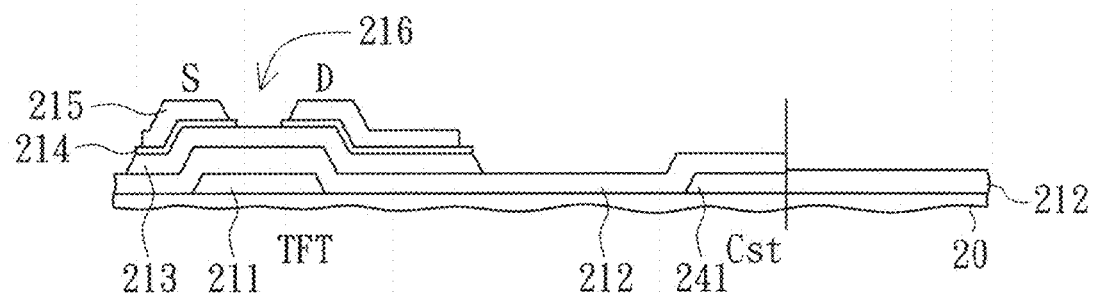

Next, a gate insulating layer 212, is formed on the gate electrode 211, covers the bottom electrode 241 of the storage capacitor, and is located on a portion of the substrate corresponding to the blank area 13b/13c. Then, a channel layer 213, an ohmic contact layer 214, and a second metal layer 215 are formed over the gate insulating layer 212, preferably, the layers are in order. As shown in FIG. 3B, a data line (not shown in figures), a source S, a drain D, a channel region 216 between the source S and the drain D, and the contact pads connected to the end of the data line are formed after the second metal layer 215 (by using a second mask) is etched. Moreover, a TFT device is formed by the channel layer 213, the ohmic contact layer 214, the source S, the drain D, the gate 211, and the gate insulating layer 212 in the area of the TFT device. The TFT device is positioned at the crossing region of the data lines (not shown) and the gate lines (not shown).

The gate insulating layer 212 comprises inorganic insulating material (such as silicon nitride, silicon oxide, silicon oxynitride, or the like), organic insulating material (such as silicon carbide, polyester, photoresist, or the like), or combinations thereof.

The channel layer 213 and the ohmic contact layer 214 comprise amorphous silicon, poly silicon, microcrystalline silicon, mono-crystalline silicon, or combinations thereof. The doping of the ohmic contact layer 214, for example, comprises N-type, P-type, or combinations thereof.

Figure 3C:
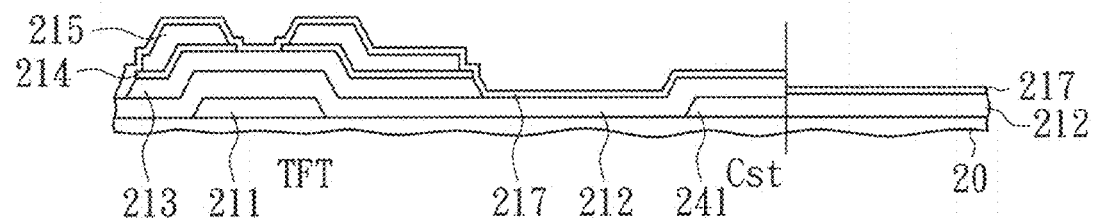

Next, a passivation layer 217 is formed to cover the source S, the drain D, and the channel region 216 in the area of the TFT device, as shown in FIG. 3C. The passivation layer 217 also covers a portion of the gate insulating layer 212 which is formed over the storage capacitor 241. The passivation layer 217 further covers a portion of the insulating layer 212 which is in the blank area 13b/13c. For example, the passivation layer 217 comprises inorganic insulating material (such as silicon nitride, silicon oxide, silicon oxynitride, or the like), organic insulating material (such as silicon carbide, polyester, photoresist, or the like) or combinations thereof. Furthermore, the gate insulating layer 212 and the passivation layer 217 could be acted as an insulating multilayer hereinafter.

Figure 3D:
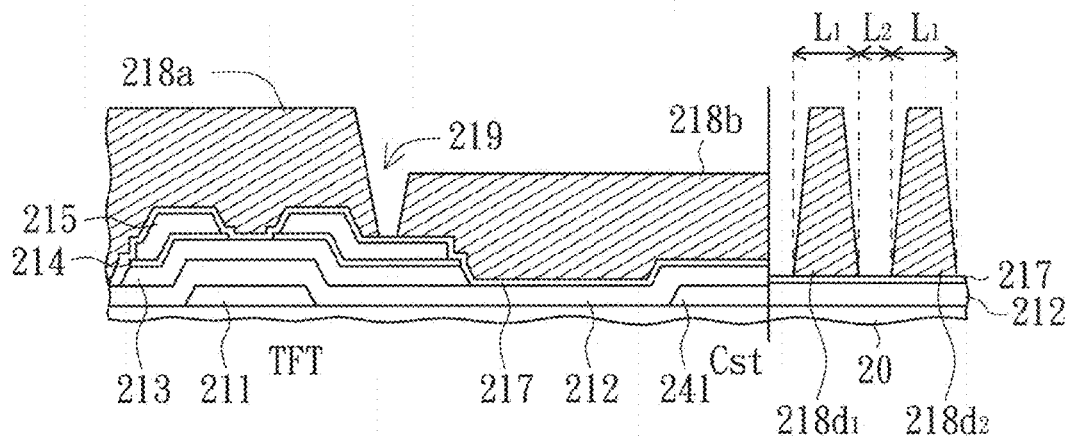

Afterward, a photoresist layer is formed in the display area 11, the periphery area 12, and the blank area by a mask manufacturing process (for example, by using a halftone mask, a diffraction mask, a gray-scale mask, a slit pattern mask, or the like). As shown in FIG. 3D, photoresist layers 218a, 218b and photoresist regions $218d_1$, $218d_2$ ... $218d_n$ are formed over the passivation layer 217. The photoresist layer 218a is formed corresponding to the area of the TFT device. The photoresist layer 218b is formed corresponding to the pixels in the display area 11 except in the area of the TFT device and part of the area of the TFT device. A hole 219 is formed between the photoresist layers 218a and 218b to expose a portion of the passivation layer 217 over the area of the TFT device. The photoresist regions $218d_1$, $218d_2$ ... $218d_n$ are spaced apart each other and formed correspondingly in the blank area 13b/13c. The height of the photoresist layer 218a is substantially identical to that of the photoresist regions $218d_1$, $218d_2$ ... $218d_n$. The height of the photoresist layer 218b is substantially less than the photoresist layer 218a and the photoresist regions $218d_1$, $218d_2$ ... $218d_n$.

Compared to the convention manufacturing method (referring to FIG. 2D and FIG. 3D), the photoresist layer in the blank area 13b/13c over the insulating multilayer (including the gate insulating layer 212 and the passivation layer 217) according to the first embodiment (FIG. 3D) has been divided into several independent photoresist regions $218d_1$, $218d_2$ ... $218d_n$ whose bottoms are not connected to each other, namely, whose bottoms are separated from each other. In other words, portions of the passivation layer 217 in the blank area 13b/13c are exposed after the formation of photoresist regions $218d_1$, $218d_2$ ... $218d_n$. In the present embodiment of the invention, at least one of the length $L_1$ and the width of at least part of the photoresist regions, preferably, are substantially less than or substantially equal to 1500 μm. The gap $L_2$ between two adjacent photoresist regions, preferably, is substantially greater than 2 μm or substantially equal to 2 μm.

Figure 3E:
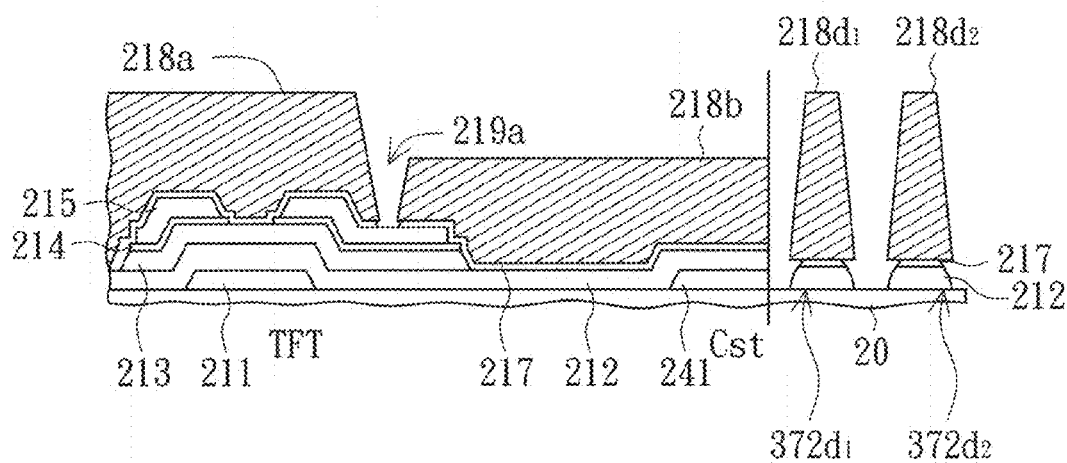

As shown in FIG. 3E, a portion of the exposed passivation layer 217 and portions of the exposed insulating multilayer are removed. A portion of the passivation layer 217 exposed by the hole 219 is etched to form a hole 219a in the area of the TFT device of the display area 11 so as to expose a portion of the drain/source in the area of the TFT device through the hole 219a. The insulating multilayer is etched according to the photoresist regions $218d_1$, $218d_2$ ... $218d_n$, so that several insulating patterns, or called several insulating islands $372d_1$, $372d_2$ ... $372d_n$, are formed in the blank area 13b/13c. Each insulating pattern (i.e. insulating patterns $372d_1$, $372d_2$ ..., or $372d_n$) includes the gate insulating layer 212 and the passivation layer 217. The bottoms of the insulating patterns $372d_1$, $372d_2$ ... $372d_n$ are formed separately on the substrate 20.

Figure 3F:
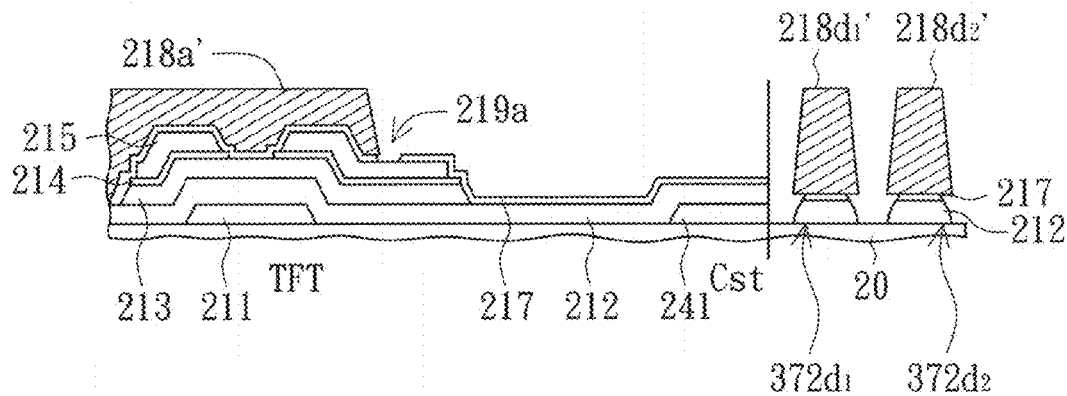

Subsequently, the photoresist layers 218a and 218b in the display area 11 and the photoresist regions $218d_1$, $218d_2$ ... $218d_n$ in the blank area 13b/13c are subjected to an ashing process to completely remove the photoresist layer 218b which is not in the area of the TFT device of the display area 11 and part of the area of the TFT device of the display area. During the ashing step, the photoresist layers 218a and the photoresist regions $218d_1$, $218d_2$ ... $218d_n$ are also partially removed or the size of the photoresist layers 218a and the photoresist regions $218d_1$, $218d_2$ ... $218d_n$ are also partially shrunken. As shown in FIG. 3F, after the ashing step, a first photoresist part 218a' is formed over the area of the TFT device. Second photoresist parts $218d_1'$, $218d_2'$ ... $218d_n'$ are formed on the insulating patterns $372d_1$, $372d_2$ ... $372d_n$. The photoresist layer 218b is removed completely. The ashing step can be performed by plasma trimming, ionic gas process or the like.

Figure 3G:
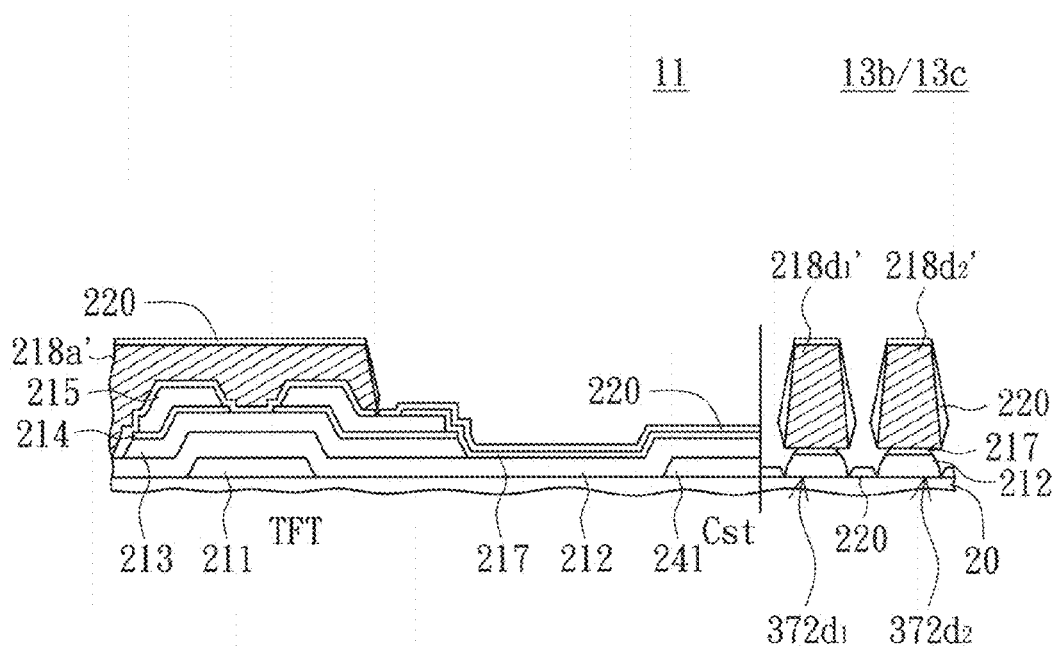

Next, a conductive layer 220 is formed in the display area 11, the periphery area 12, and the blank area. In the display area 11, the conductive layer 220 covers the first photoresist part 218a' on the TFT device, filling into the hole 219a of each TFT device, and a portion of the passivation layer 217 which is not on the TFT device. The conductive layer 220 further covers the second photoresist parts $218d_1'$, $218d_2'$ ... $218d_n'$ and a portion of the substrate 20 in the blank area 13b/13c, as shown in FIG. 3G.

The conductive layer 220 comprises transparent conductive materials, reflective conductive materials, metal alloys, or combinations thereof. Examples of the transparent conductive materials include indium tin oxide (ITO), indium zinc oxide (IZO), cadmium tin oxide (CTO), and aluminum zinc oxide (AZO). Examples of the reflective conductive materials include molybdenum (Mo), aluminum (Al), gold (Au), silver (Ag), copper (Cu), neodymium (Nd), wolfram (W), cadmium (Cd), titanium (Ti), tantalum (Ta), oxide thereof, oxynitride thereof, nitride thereof, or combinations thereof.

Figure 3H:
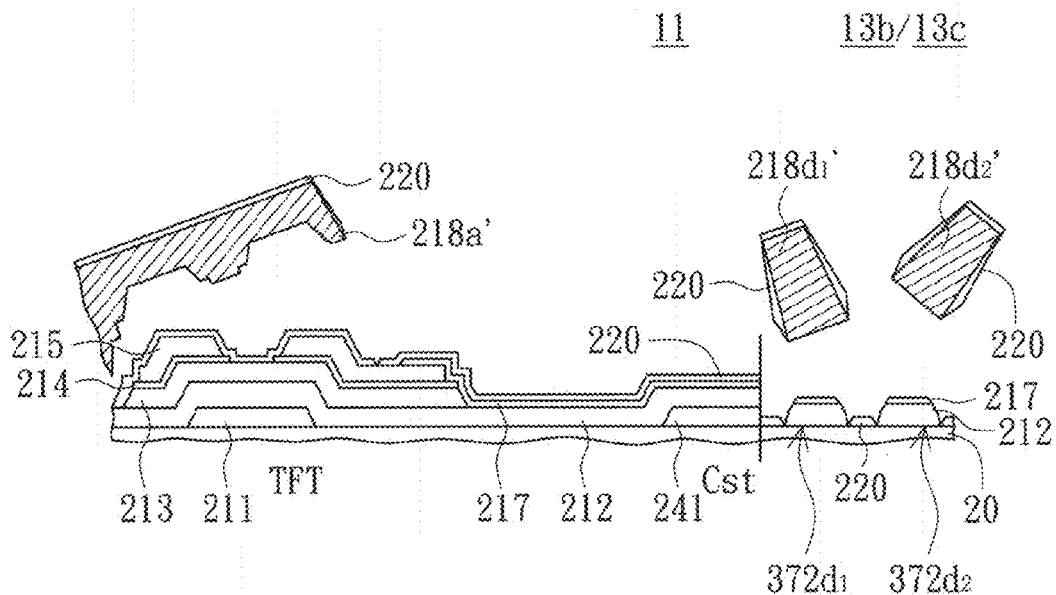

Finally, the photoresist layers are removed by a lift-off step, as shown in FIG. 3H. The first photoresist part $218a'$ in the display area 11, the conductive layer 220 over the first photoresist part $218a'$, the second photoresist parts $218d_1'$, $218d_2'$ ... $218d_n'$, and the conductive layer 220 over the second photoresist parts $218d_1'$, $218d_2'$ ... $218d_n'$ are removed.

According to the manufacturing method of the present embodiment of the invention, after the photoresist layers are removed (referring to FIG. 3H), the insulating patterns $372d_1$, $372d_2$ ... $372d_n$ and the first conductive pattern layer (such as the conductive layer 220) formed on the substrate 20 are remained in the blank area 13b/13c. The insulating patterns $372d_1$, $372d_2$ ... $372d_n$ in the blank area 13b/13c are isolated by the first conductive pattern layer. Moreover, because the insulating patterns $372d_1$, $372d_2$ ... $372d_n$ are formed by etching the insulating multilayer (such as including the gate insulating layer 212 and the passivation layer 217) according to the photoresist regions $218d_1$, $218d_2$ ... $218d_n$, at least one of the length/width of at least part of the insulating patterns $372d_1$, $372d_2$ ... $372d_n$, preferably, are substantially less than or substantially equal to 1500 µm, and the distance between two adjacent insulating patterns, preferably, is substantially greater than or substantially equal to 2 µm. Furthermore, although the first conductive pattern layer (such as the conductive layer 220) is directly formed on the substrate 20, is not a result of a short circuit in the non-metal line region.

Second Embodiment

Figure 4A:
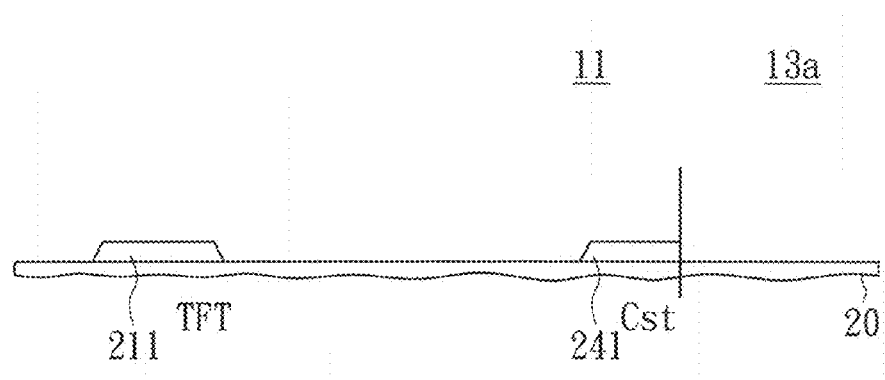
FIGS. 4A~FIG. 4H are a method for manufacturing a display panel according to the second embodiment of the present invention.
Figure 4B:
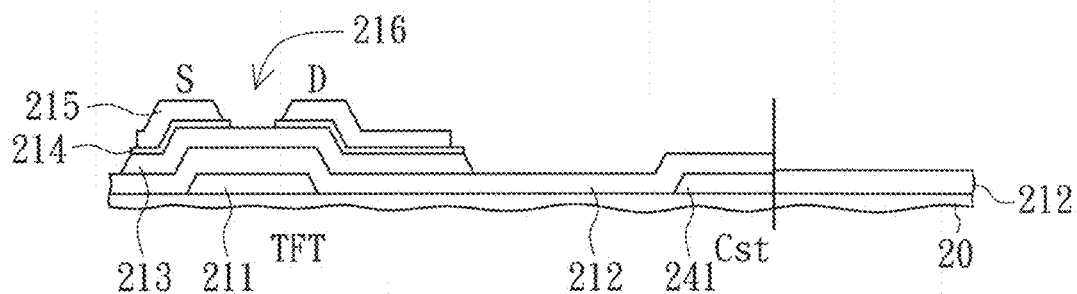
Figure 4C:
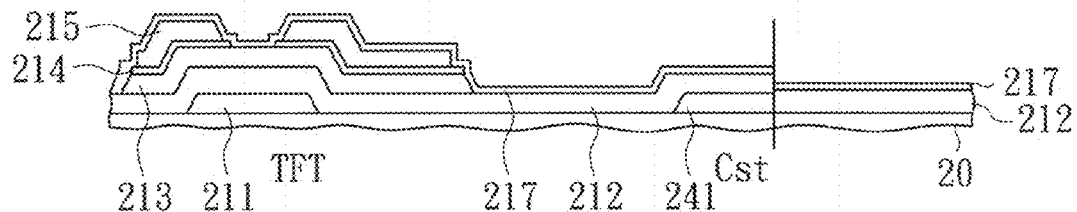

FIGS. 4A~4H are a method for manufacturing a display panel according to a second embodiment of the present invention. The blank area 13a is illustrated as an example in the second embodiment of the present invention. Generally, metal lines or a metal pattern region is under the insulating multilayer of the blank area 13a. Therefore, the blank area 13a could also be called as a metal-line region or a metal pattern region. Examples of the metal lines in the metal-line region include a signal line, a dummy line, a test line, a repair line, a shielding line, shielding ring, an electric static discharge (ESD) component, or the likes, or combinations thereof. However, the method of the second embodiment can also be applied to other blank areas, such as the blank area 13b or the blank area 13c. Furthermore, a pixel is illustrated as an example in the present embodiment, and each pixel includes at least one TFT device and at least one storage capacitor. However, it is known by people skilled in the art that a display panel includes numerous pixels. Referring to FIG. 1 at the same time. The steps in FIG. 4A~FIG. 4C are the same as those in FIG. 3A~FIG. 3C. Referring to the relative content in the first embodiment of the present invention. The same steps are unnecessary described repeatedly in the second embodiment of the present invention.

After the step of forming the passivation layer 217 is completed, the insulating multilayer including the gate insulating layer 212 and the passivation layer 217 is formed in the blank area 13a over the substrate 20, as shown in FIG. 4C.

Figure 4D:
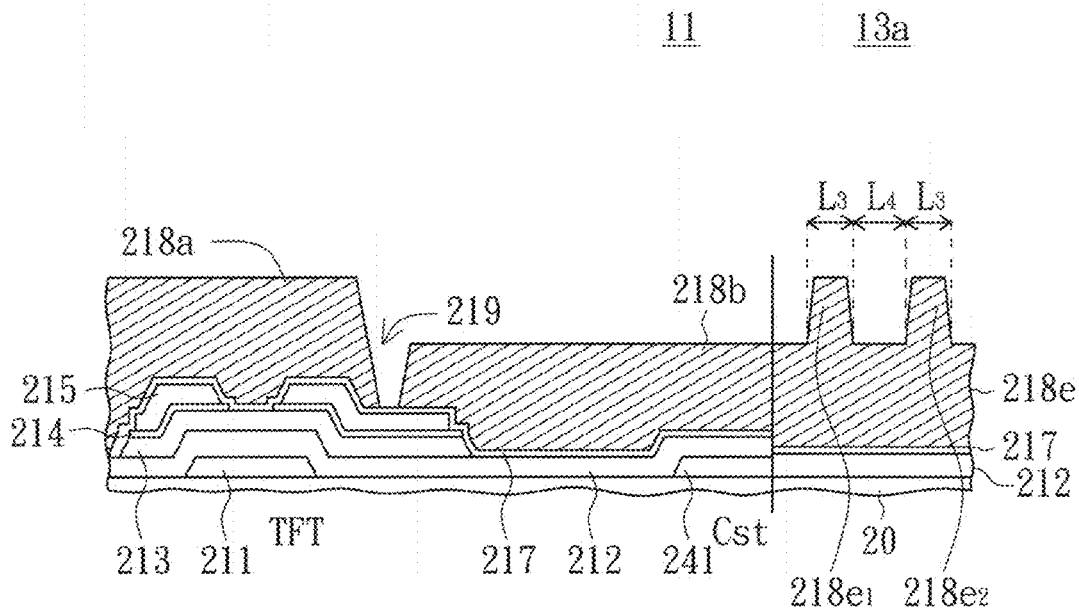
Figure 4E:
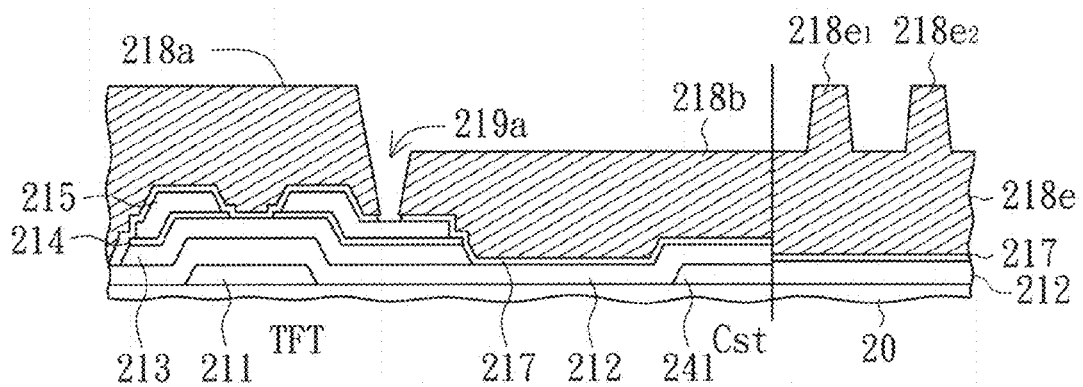

Then, a photoresist layer is formed by an exposure and development process using a mask (such as a halftone mask, a diffraction mask, a gray-scale mask, a slit pattern mask, or the like) in the display area 11, the periphery area 12, and the blank area. The photoresist layers 218a and 218b are formed over the passivation layer 217 in the display area 11. The photoresist layer 218e with several photoresist bumps $218e_1$, $218e_2$ ... $218e_n$ is formed over the insulating multilayer in the blank area 13a. A hole 219 is formed between the photoresist layers 218a and 218b to expose a portion of the passivation layer 217 in the area of the TFT device, as shown in FIG. 4D. Next, the portion of the exposed passivation layer 217 and a portion of the insulating multilayer are removed. The portion of the passivation layer 217 exposed by the hole 219 is etched to form hole 219a in the area of the TFT device of the display area 11, so that to expose a portion of the drain/source in the area of the TFT device as shown in FIG. 4E.

According to the second embodiment, the maximum height (from the bottom surface of the photoresist layer 218e to one of the top ends of the photoresist bumps) of the photoresist layer 218e is substantially identical to the height of the photoresist layer 218a. The minimum height (from the height of the photoresist layer 218e without one of the photoresist bumps) of the photoresist layer 218e is substantially identical to that of the photoresist layer 218b.

Compared to the conventional manufacturing method (referring to FIG. 2D and FIG. 4D), the photoresist bumps $218e_1$, $218e_2$ ... $218e_n$ of the second embodiment are regarded to be separated from the bottom in the step of the second embodiment. Preferably, at least one of the length $L_3$ and the width of at least part of the photoresist bumps are substantially less than or substantially equal to 1500 µm, and the distance $L_4$ between two adjacent photoresist bumps is substantially greater than or substantially equal to 2 µm.

Figure 4F:
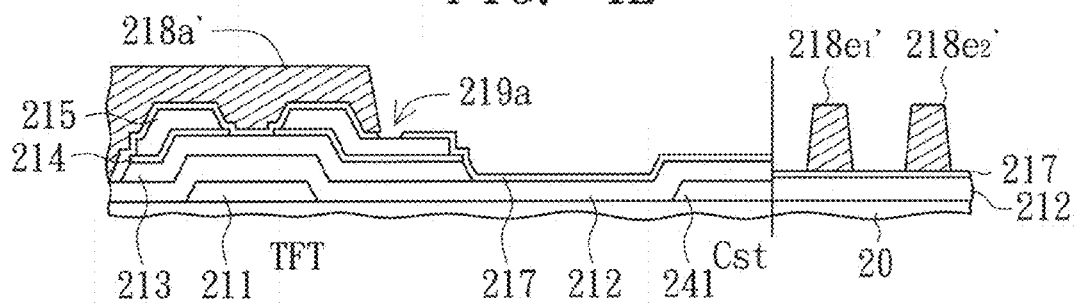

Then, the photoresist layers 218a and 218b in the display area 11, the photoresist layer 218e in the blank area 13a, and the photoresist bumps $218e_1$, $218e_2$ ... $218e_n$ are etched, as shown in FIG. 4F. After the etching step is completed, a first photoresist part $218a'$ is formed over the TFT device, the photoresist layer, or called a second photoresist part 218b is removed completely, and the third photoresist parts $218e_1'$, $218e_2'$ ... $218e_n'$ are formed over the insulating multilayer in the blank area 13a. In other words, after the etching step, the photoresist layer 218b has a thickness substantially equal to zero and the portion of the passivation layer 217 is exposed. The etching step could be performed by plasma trimming, ionic gas process, or the like.

Figure 4G:
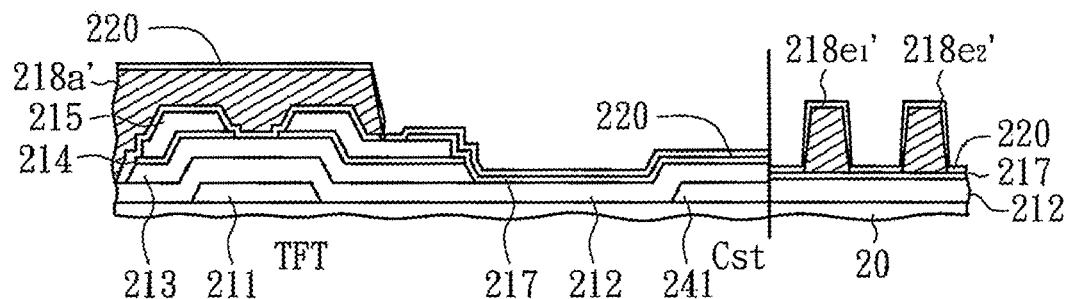

Next, a conductive layer 220 is formed in the display area 11, the periphery area 12 and the blank area, as shown in FIG. 4G. The conductive layer 220 covers a portion of the first photoresist part $218a'$ over the TFT device, filling into the hole 219a of the TFT device, and a portion of the passivation layer 217 which is not over the TFT device. The conductive layer 220 also covers the third photoresist parts $218e_1'$, $218e_2'$ ... $218e_n'$ and a portion of the insulating multilayer (such as over the passivation layer 217).

Figure 4H:
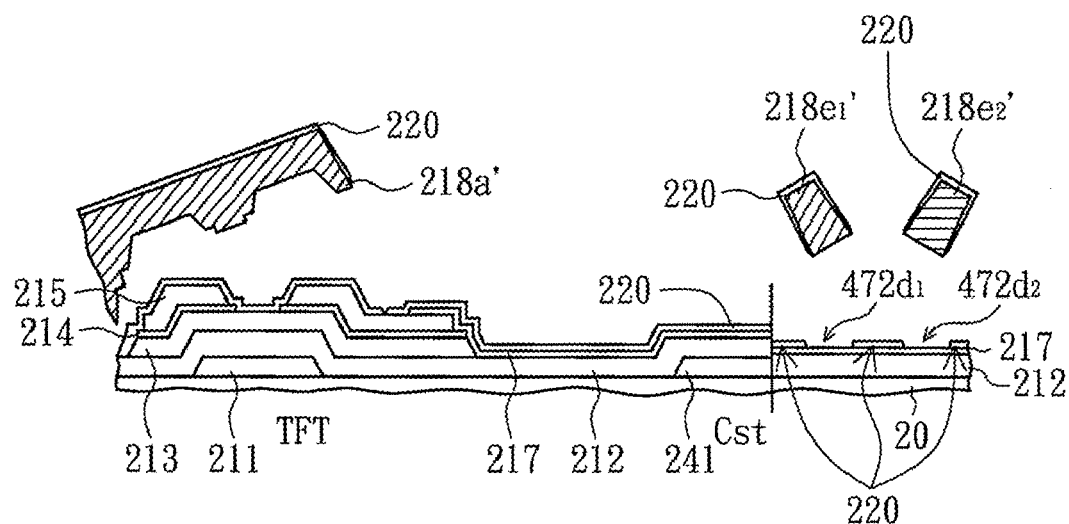

Finally, the first photoresist part $218a'$ in the display area 11, the third photoresist parts $218e_1'$, $218e_2'$ ... $218e_n'$ in the blank area 13a, and the conductive layer 220 formed thereon (such as on the first photoresist part $218a'$ and on the third photoresist parts) are removed, as shown in FIG. 4H.

In the method of the present embodiment of the invention, after the photoresist layers are removed (referring to FIG.

4H), a second conductive pattern layer (such as the conductive layer 220 remained on part of the passivation layer 217) is formed over the insulating multilayer in the blank area 13a. Several insulated zones $472d_1, 472d_2 \ldots 472d_n$ are isolated by the second conductive pattern layer on the surface of the insulating multilayer, namely, the second conductive pattern layer surrounded by the surface of the insulating multilayer to form several insulated zones. Moreover, the isolated zones are formed after removing the third photoresist parts $218e_1', 218e_2' \ldots 218e_n'$, and the size of the third photoresist parts are decided by the photoresist bumps $218e_1, 218e_2 \ldots 218e_n$. Therefore, at least one of the length/width of at least part of the isolated zones, preferably, are substantially less than or substantially equal to 1500 μm, and the distance between two adjacent isolated zones, preferably, is substantially greater than 2 μm. Furthermore, the second conductive pattern layer is formed over the insulating multilayer. In other words, the substrate 20 in the blank area 13a is protected by the insulating multilayer. Therefore, although the method of the present embodiment of the invention is applied to the blank area 13a having metal lines or metal pattern in the substrate 20, there is no short-circuit issue to be concerned.

According to the first and second embodiments of the present invention, the photoresist regions $218d_1, 218d_2 \ldots 218d_n$ (FIG. 3D) are formed in the blank area 13b/13c, and the photoresist layer 218e (FIG. 4D) including the photoresist bumps $218e_1, 218e_2 \ldots 218e_n$ are formed in the blank area 13a, respectively. Therefore, all the photoresist layers in the blank areas can be removed quickly and completely in the subsequent lift-off step, without the occurrence of photoresist residues.

Although metal lines or patterns formed in the blank area 13a under the insulating multilayer is taken for illustration in the second embodiment of the present invention, metal lines or patterns can be also arranged in other blank areas such as area 13b or 13c according to the design of the display panel or reliability requirements. Examples of metal lines or patterns include a signal line, a dummy line, a test line, a repair line, a shielding line, shielding ring, a static electric discharge (ESD), or the like, or combinations thereof. Moreover, the design of the above embodiments of the present invention can also be applied to the display panel at the same time. For example, metal lines or patterns are formed in the blank areas 13b and 13c under the insulating multilayer. Metal lines or patterns can be formed in the blank areas 13a, 13b, and 13c under the insulating multilayer. Metal lines or patterns and non-metal lines or patterns can be formed in one of the blank areas 13a, 13b, and 13c under the insulating multilayer. Metal lines or patterns are formed under the insulating multilayer in the blank areas 13a and 13c but not formed in the blank area 13b. Metal lines or patterns are formed under the insulating multilayer in the blank areas 13a and 13b but not formed in the blank area 13c. When metal lines/patterns or/and non-metal lines/patterns are formed in one of the blank areas 13a, 13b, and 13c under the insulating multilayer, the photoresist regions in the above blank areas can be removed at the same time. Moreover, the display panel in the above-mentioned embodiments can be applicable in varied types of displays, to look into the conductive layer 220 contacted with a materials comprising liquid crystal component, organic electroluminescent component (such as low molecule, poly molecule, or combinations), inorganic electroluminescent component, or the likes, or combinations thereof.

The above-description is a detailed illustration for a variety of preferred embodiments of the present invention. The embodiments should not be construed as limiting the scope of the invention. Rather, it is intended to cover various modifications and similar arrangements included within the spirit and scope of the appended claims, the scope of which should be accorded the broadest interpretation so as to encompass all such modifications and similar structure.

What is claimed is:

1. A display panel, comprising:
    a substrate having a display area and a blank area adjacent to the display area, the blank area comprising:
    a non-metal line region having a plurality of insulating patterns and a first conductive pattern layer formed on the substrate, the insulating patterns spaced apart from each other by the first conductive pattern layer; and
    a metal-line region having an insulating multilayer formed on the substrate and a second conductive pattern layer formed on the insulating multilayer, so that a plurality of isolated zones are formed on a surface of the insulating multilayer by the second conductive pattern layer.

2. The panel according to claim 1, wherein at least one of a length and a width of at least part of the isolated zones are substantially less than or substantially equal to 1500 μm.

3. The panel according to claim 2, wherein a distance between two adjacent isolated zones is substantially greater than or substantially equal to 2 μm.

4. The panel according to claim 1, wherein the insulating multilayer comprises:
    a gate insulating layer formed on the substrate; and
    a passivation layer formed on the gate insulating layer.

5. The panel according to claim 1, wherein at least one of a length and a width of at least part of the insulating patterns are substantially less than or substantially equal to 1500 μm.

6. The panel according to claim 1, wherein a distance between two adjacent insulating patterns is substantially greater than or substantially equal to 2 μm.

7. The panel according to claim 1, wherein each insulating pattern comprises an insulating multilayer, comprising:
    a gate insulating layer formed on the substrate; and
    a passivation layer formed on the gate insulating layer.

* * * * *